United States Patent
Donohoe

(10) Patent No.: US 6,315,859 B1
(45) Date of Patent: Nov. 13, 2001

(54) APPARATUS AND METHOD FOR IMPROVING UNIFORMITY IN BATCH PROCESSING OF SEMICONDUCTOR WAFERS

(75) Inventor: Kevin G. Donohoe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/456,218

(22) Filed: Dec. 7, 1999

Related U.S. Application Data

(63) Continuation of application No. 08/904,746, filed on Aug. 1, 1997, which is a continuation of application No. 08/605,331, filed on Feb. 16, 1996, now abandoned.

(51) Int. Cl.$^7$ .............................. H05H 1/00; C23C 16/00; H01L 21/302
(52) U.S. Cl. ...................... 156/345; 118/724; 118/715; 438/714
(58) Field of Search ................................... 118/715, 692, 118/696, 699, 722, 706, 66, 724; 156/345; 438/714, 909, 935; 216/67

(56) References Cited

U.S. PATENT DOCUMENTS

| | | | |
|---|---|---|---|
| 3,765,926 | 10/1973 | Ramachandran | 427/9 |
| 4,440,618 * | 4/1984 | Suzuki et al. | 204/298.03 |
| 4,563,367 | 1/1986 | Sherman | 427/39 |
| 4,636,401 | 1/1987 | Yamazaki et al. | 427/39 |
| 4,728,869 | 3/1988 | Johnson et al. | 318/335 |
| 4,935,661 | 6/1990 | Heinecke et al. | 313/231.31 |
| 5,013,400 | 5/1991 | Kurasaki et al. | 156/643 |
| 5,147,687 | 9/1992 | Garg et al. | 427/249 |
| 5,167,716 | 12/1992 | Boitnott et al. | 118/719 |
| 5,296,412 * | 3/1994 | Ohsawa | 438/542 |
| 5,413,663 | 5/1995 | Shimizu et al. | 156/345 |
| 5,460,689 | 10/1995 | Raaijmakers et al. | 156/643.1 |
| 5,474,650 | 12/1995 | Kumihashi et al. | 438/714 |
| 5,482,748 | 1/1996 | Soderberg et al. | 118/728 |
| 5,514,453 | 5/1996 | Goujard et al. | 428/213 |
| 5,525,550 * | 6/1996 | Kato | 438/788 |
| 5,637,190 | 6/1997 | Liao | 216/67 |
| 5,685,912 * | 11/1997 | Nishizaka | 118/719 |
| 5,693,179 | 12/1997 | Blackburn et al. | 156/643.1 |
| 5,716,484 * | 2/1998 | Blackburn et al. | 156/345 |
| 5,777,300 * | 7/1998 | Homma et al. | 219/679 |

* cited by examiner

Primary Examiner—Gregory Mills
Assistant Examiner—P. Hassanzadeh
(74) Attorney, Agent, or Firm—Ormiston & McKinney, PLLC

(57) ABSTRACT

A novel batch processing system used, for example, in plasma etching and chemical vapor deposition, wherein the pressure in the reactor is cycled through a varying pressure to increase the transfer of the reactant materials to the center of the wafer. One version of the invention provides a method that includes the steps of (I) feeding reactant gases into a reaction vessel, (ii) exhausting unused reactive gases and/or reaction by-products from the reaction vessel, and (iii) cycling the pressure in the reaction vessel between a higher pressure $P_{high}$ and a lower pressure $P_{low}$. Another version of the invention provides an apparatus that comprises (I) a reaction vessel, (ii) a feed means for feeding reactive gases into the reaction vessel, (iii) an exhaust means for exhausting unused reactive gases and/or reaction by-products from the reaction vessel, and (d) a pressure control means for cycling the pressure in the reaction vessel between a higher pressure $P_{high}$ and a lower pressure $P_{low}$. In one aspect of the invention, the higher pressure $P_{high}$ is maintained for a predetermined period of time $T_{high}$ and the lower pressure $P_{low}$ is maintained for a predetermined period of time $T_{low}$.

18 Claims, 5 Drawing Sheets

APPARATUS AND METHOD FOR IMPROVING UNIFORMITY IN BATCH PROCESSING OF SEMICONDUCTOR WAFERS

CROSS REFERENCE TO RELATED APPLICATIONS

This is a continuation of application Ser. No. 08/904,746 filed Aug. 1, 1997, which is a continuation of application Ser. No. 08/605,331 filed Feb. 16, 1996, abandoned.

FIELD OF THE INVENTION

The invention relates generally to batch processing of semiconductor wafers using, for example, plasma etching or chemical vapor deposition. More particularly, the invention relates to a batch processing system wherein the pressure in the process reactor is cycled through varying pressures to improve the uniformity of such deposition and etch processes.

BACKGROUND OF THE INVENTION

Semiconductor devices are constructed of patterned layers of electrically conductive, non-conductive and semi-conductive materials stacked over a silicon wafer. The layers of material are successively deposited on the wafer and etched into predefined patterns to form individual component structures within the particular device being fabricated. The manufacturing process often includes deposition and/or etch steps in which semiconductor wafers are processed in a group or "batch." Batch processing tools include barrel reactors, diffusion furnaces and the like, wherein each batch of wafers may be subjected to various chemical, mechanical or electrical processes.

The rate of production of conventional batch processing tools, such as those used for plasma etching and chemical vapor deposition, is often limited by the diffusion of reactant gases or reaction products to the center of the wafers. This is especially true in tube shaped reactors which hold a batch of wafers closely spaced and parallel to one another. In such conventional reactors, which are operated at a near constant pressure, the gaseous reactants and reaction products diffuse through the small space between the wafers. The diffusion of the reactants and reaction products to the center of the wafers is typically the slowest step in the deposition or etch process. In addition, the chemical and mechanical processes through which materials are deposited on or etched off the surfaces of a wafer occur more slowly at the center of the wafer than at the edge of the wafer. Therefore, the deposition or etch profile tends to be non-uniform across the surface of the wafer. That is, more material is deposited on or etched from the edge of the wafer than is deposited on or etched from the center of the wafer.

SUMMARY OF THE INVENTION

The present invention is directed to a novel batch processing system wherein the pressure in the reactor is cycled through a varying pressure to increase the transfer of the reactant materials to the center of the wafer. One object of the invention is to improve the uniformity across the surface of the wafer of the deposition or etch process carried out in batch processing tools. It is another object of the invention to increase the rate of transfer of the reactant materials to the center of the wafer and thereby increase throughput in batch processing systems.

These and other objects and advantages may be achieved by a method for improving uniformity in batch processing of semiconductor wafers that includes the steps of (i) feeding reactant gases into a reaction vessel, (ii) exhausting unused reactive gases and/or reaction by-products from the reaction vessel, and (iii) cycling the pressure in the reaction vessel between a higher pressure $P_{high}$ and a lower pressure $P_{low}$. Another version of the invention provides an apparatus for batch processing semiconductor wafers used, for example, in plasma etching and chemical vapor deposition. The apparatus comprises (i) a reaction vessel, (ii) a feed means for feeding reactive gases into the reaction vessel, (iii) an exhaust means for exhausting unused reactive gases and/or reaction by-products from the reaction vessel, and (iv) a pressure control means for cycling the pressure in the reaction vessel between a higher pressure $P_{high}$ and a lower pressure $P_{low}$.

In one aspect of the invention, the higher pressure $P_{high}$ is maintained for a predetermined period of time $T_{high}$ and the lower pressure $P_{low}$ is maintained for a predetermined period of time $T_{low}$. In one preferred version of the invention, wherein the method or apparatus is used in plasma etching, the higher pressure $P_{high}$ is in the range of 500 millitorr to 1500 millitorr, the lower pressure $P_{low}$ is in the range of 200 millitorr to 400 millitorr, $T_{high}$ is in the range of 5 milliseconds to 50 milliseconds, and $T_{low}$ is in the range of 0 to 100 milliseconds. In a second preferred version of the invention, wherein the method or apparatus is used in chemical vapor deposition, the higher pressure $P_{high}$ is in the range of 100 millitorr to 500 millitorr, the lower pressure $P_{low}$ is in the range of 50 millitorr to 500 millitorr, $T_{high}$ is in the range of 5 milliseconds to 50 milliseconds, and $T_{low}$ is in the range of 5 milliseconds to 200 milliseconds.

DETAILED DESCRIPTION OF THE INVENTION

Figure 1:
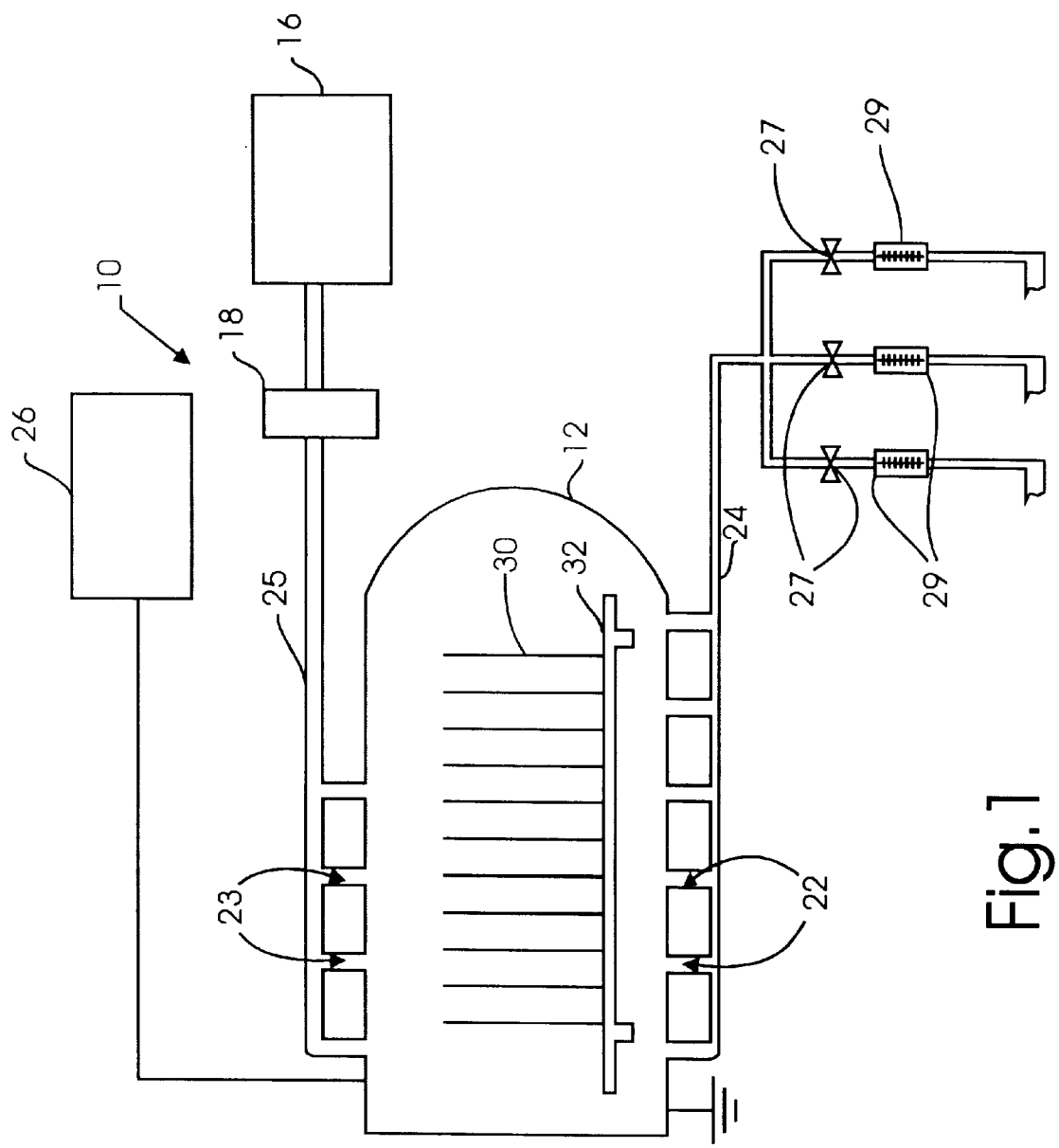
FIG. 1 is a schematic side view of a plasma etch barrel reactor.
Figure 2:
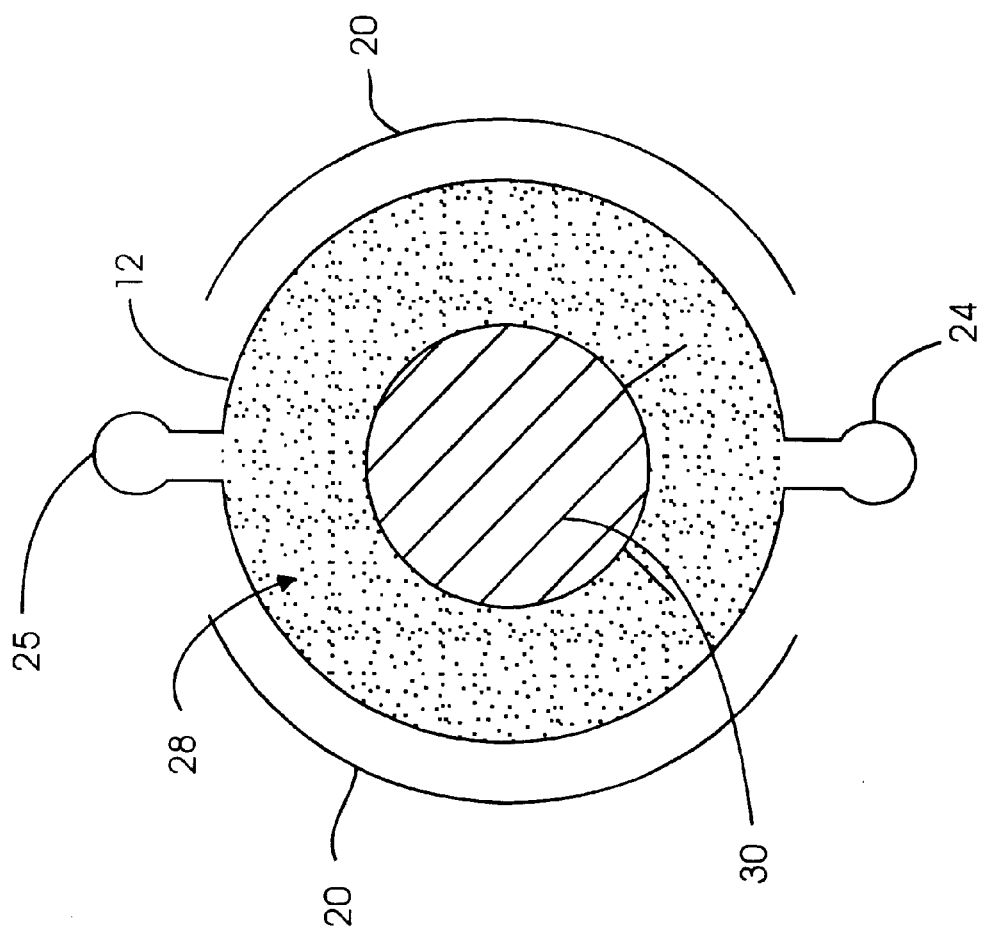
FIG. 2 is a schematic cross section view of the plasma etch barrel reactor of FIG. 1.

The invention will first be described with reference to plasma etching as one exemplary embodiment of the invention. FIGS. 1 and 2 are schematic representations of a barrel reactor typically used to conduct plasma etching of semiconductor wafers. Such reactors are also sometimes referred to as "barrel etchers." Referring to FIGS. 1 and 2, the basic components of barrel reactor 10 include a reaction vessel 12, exhaust pump 16, pressure control mechanism 18, electrodes 20. In plasma etching, a glow discharge is utilized to produce chemically reactive species (atoms, radicals and ions) from a relatively inert molecular gas, such as carbon tetraflouride $CF_4$. The etching gas is selected so as to generate species that react chemically with the material to be etched on the surface of the wafers. A conventional barrel reactor, such as those produced by Branson Co. or International Plasma Corp., may be adapted for use in accordance with the invention as described herein.

In operation, wafers 30 are loaded into a cassette or "boat" 32 at the center of reaction vessel 12. The etching gas is fed into reaction vessel 12 through flow meters 29 and valves 27. The gases are typically fed into reaction vessel 12 from a pressurized reservoir (not shown). Alternatively, the gases may be pumped into reaction vessel 12. Preferably, the etching gas is introduced into reaction vessel 12 through a series of inlet openings 22 in feed pipe 24 distributed along the length of reaction vessel 12. Similarly, unused reactant gases and reaction by products are preferably removed through a series of exhaust openings 23 in exhaust tube 25 distributed along the length of reaction vessel 12. Alternatively, the etching gas may be introduced into one end of the reaction vessel, in which case the unreacted gases and reaction by products are exhausted through the other end of the reaction vessel. Rf energy applied from rf power supply 26 to electrodes 20 excites the etching gas as it is fed into reaction vessel 12 to create plasma 28 surrounding wafers 30. Plasma 28 contains the reactive species for etching the surfaces of wafers 30.

Figure 4:
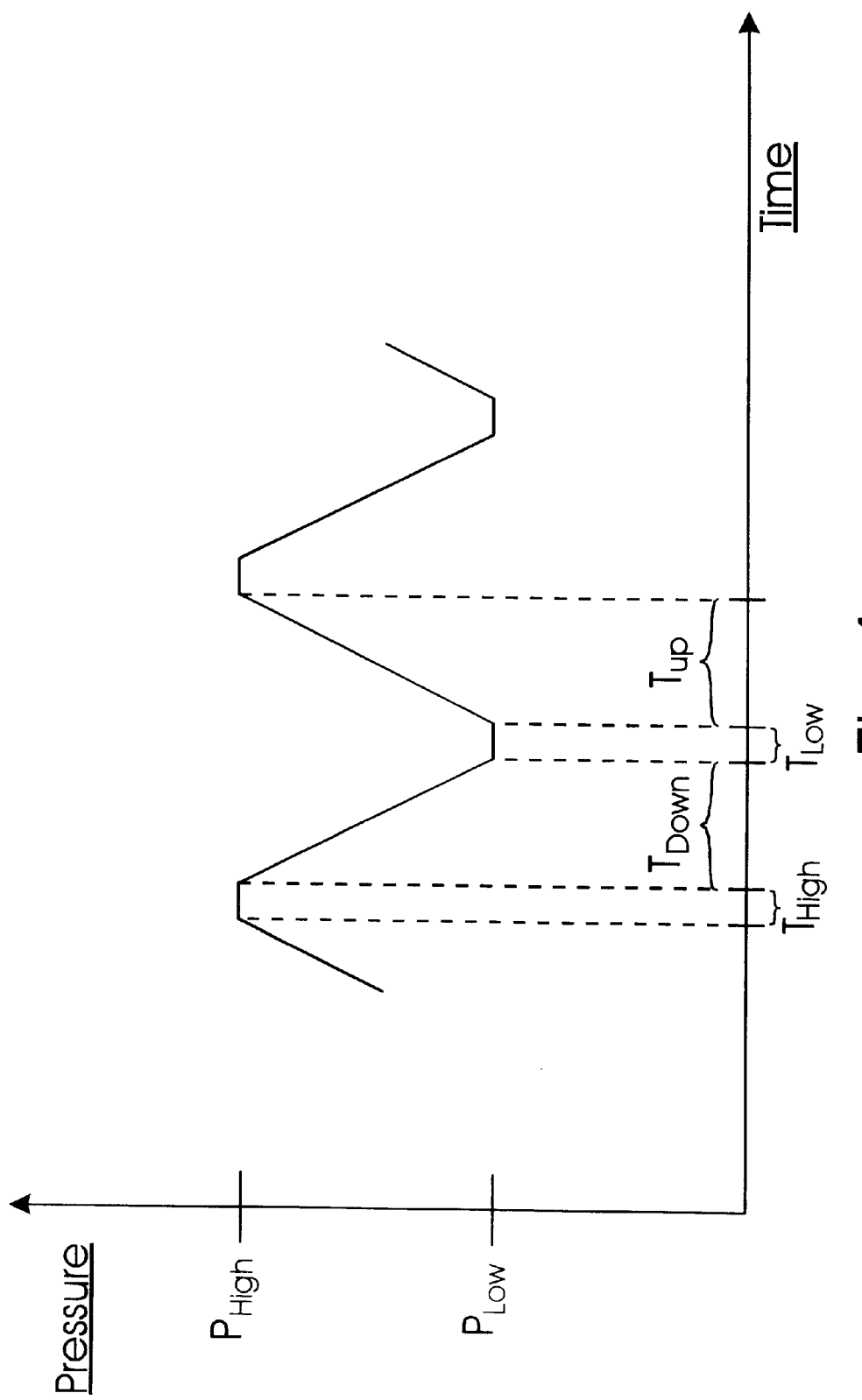
FIG. 4 is a graphical representation of the pressure as a function of time illustrating the pressure cycle in the reactor according to one embodiment of the invention wherein the higher pressure $P_{high}$ and the lower pressure $P_{low}$ are maintained for a period of time $T_{high}$ and $T_{low}$, respectively.
Figure 5:
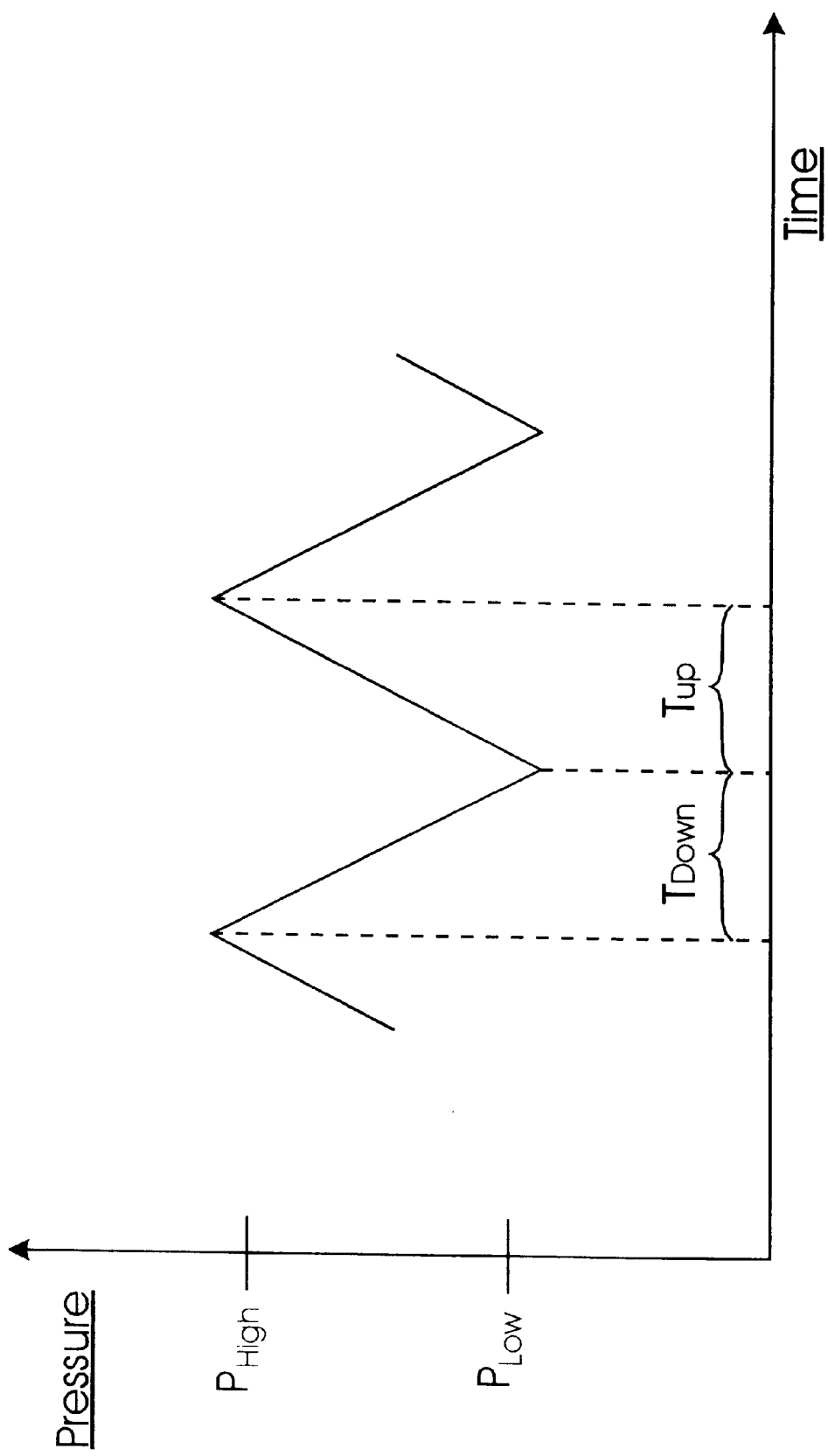
FIG. 5 is a graphical representation of the pressure as a function of time illustrating the pressure cycle in the reactor according to an alternative embodiment of the invention wherein the pressure is cycled continuously between the higher pressure $P_{high}$ and the lower pressure $P_{low}$, i.e., $T_{high}=T_{low}=0$.

The pressure in the reaction vessel is cycled between a higher pressure $P_{high}$ and a lower pressure $P_{low}$, as shown in FIGS. 4 and 5. The pressure in reaction vessel 12 may be controlled by increasing/decreasing the flow of etching gas into reaction vessel 12 or increasing/decreasing the flow of unused reactants and reaction by products out of reaction vessel 12, or a combination of both. In this embodiment, the exhaust rate of unused reactants and reaction by products is controlled by pressure control mechanism 18 which regulates and exhaust pump 16. Pressure control mechanism 18 represents generally any programmable pump controller, such as the dry pump/roots blower and butterfly throttle valve pressure controllers supplied by Alcatel, Inc. or the Edwards Company.

FIGS. 4 and 5 show two exemplary cyclical pressure variations in reaction vessel 12. The pressure is cycled between a higher pressure $P_{high}$ and a lower pressure $P_{low}$. In the embodiment shown in FIG. 4, the pressure is raised to $P_{high}$ and maintained at that pressure for a period of time $T_{high}$. The pressure in reaction vessel 12 is then reduced to $P_{low}$ and maintained at that pressure for a period of time $T_{low}$. The time to ramp up to $P_{high}$ is designated $T_{up}$. The time to ramp down to $P_{low}$ is designated $T_{down}$. In the embodiment shown in FIG. 5, the pressure is continuously ramping, that is, $T_{high}=T_{low}=0$. Cycling or "pulsing" the pressure, as shown in FIGS. 4 and 5, increases the rate at which the reactant materials are transferred to the center of wafers 30. The rate of mass transfer of reactant materials to and from the center of wafers 30 increases as the pressure varies because the forced convection from the pressure variation moves material in and out of the space between adjacent wafers faster than does the diffusion of conventional reactors operating at a constant pressure.

In general, the time $T_{high}$ during which the pressure in reaction vessel 12 remains at $P_{high}$ should, preferably, be just long enough to support the desired chemical reaction at the surface of wafers 30. The time $T_{low}$ during which the pressure in reaction vessel 12 remains at $P_{low}$ should be kept as short as possible to maintain the overall etch rate as high as possible. As will be apparent to those skilled in the art, the actual pressures and times will vary with each specific application to achieve the desired etch characteristics. The actual pressures and times will depend on the type of etch process, the materials being etched, the reactant gases, the size of the reaction vessel and the reaction time and capacity of the feed and exhaust pumps. In a typical plasma etch process, the range of pressure flow parameters would be as follows:

$P_{high}$=500–1500 millitorr;
$T_{high}$=5–50 milliseconds;
$P_{low}$=200–400 millitorr; and
$T_{low}$=0–100 milliseconds.

In a more specific example of a typical plasma etch process where a layer of photoresist material is stripped from wafers 30, a process commonly referred to as resist "ashing," and using a 12 inch diameter reaction vessel that is 20 inches long, the preferred flow parameters are as follows:

$P_{high}$ 1200 millitorr;
$T_{high}$=5–10 milliseconds;
$P_{low}$=300 millitorr; and
$T_{low}$=0–50 milliseconds.

Although, the ramp times $T_{up}$ and $T_{down}$ are preferably as short as possible, they will necessarily be limited by the reaction times and capacities of the feed and exhaust pumps. Due to these limitations, it is expected that the ramp times $T_{up}$ and $T_{down}$ will be on the order of about 100 milliseconds.

Figure 3:
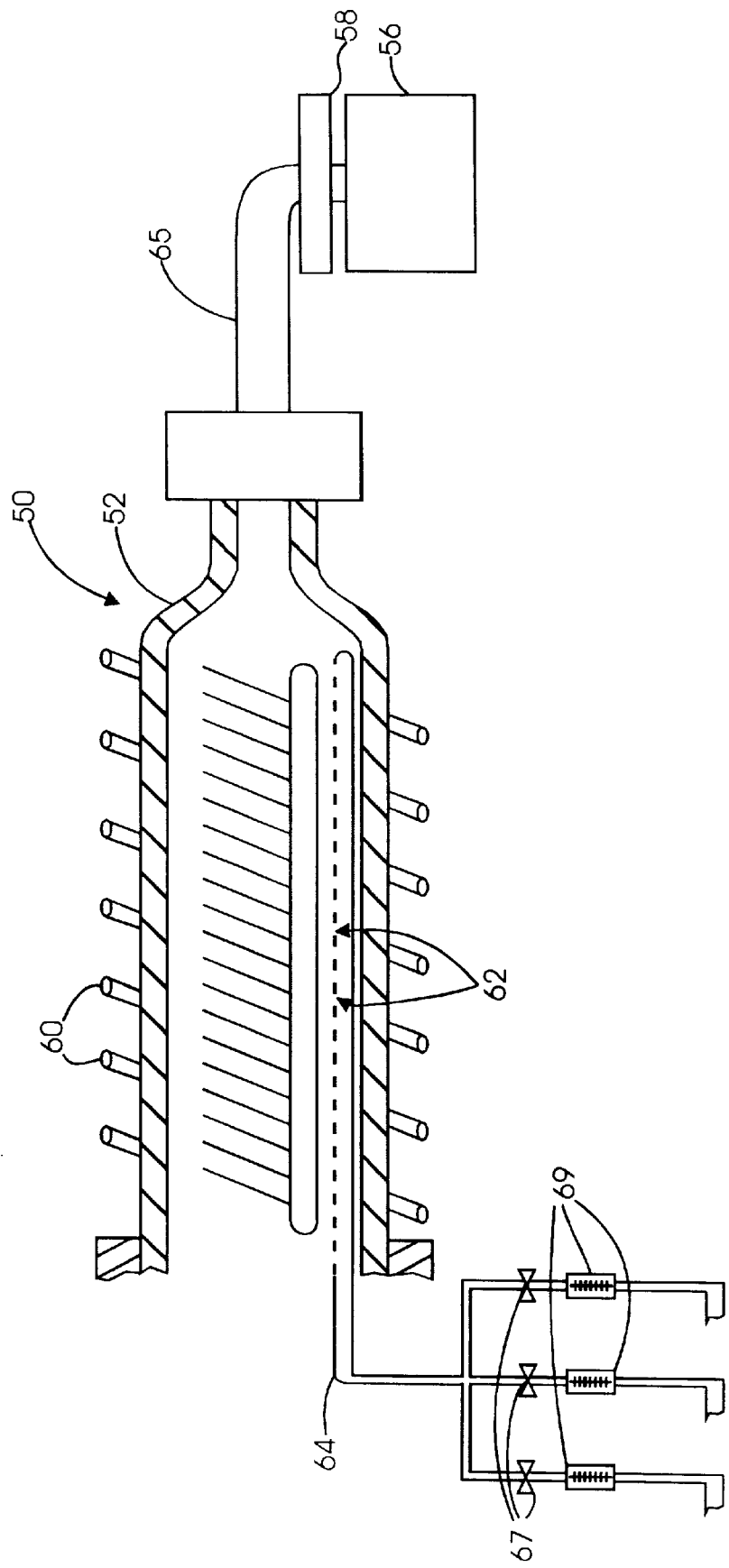
FIG. 3 is a schematic side view of a distributed feed type chemical vapor deposition reactor.

The invention will now be described with reference to chemical vapor deposition (CVD) as a second exemplary embodiment of the invention. In chemical vapor deposition, reactant gases undergo a film forming chemical reaction at the surface of the wafers. Energy to drive the reaction is most commonly supplied by thermal energy. FIG. 3 is a schematic representation of a distributed feed chemical vapor deposition reactor commonly used to deposit polysilicon, silicon nitride, silicon dioxide and phosphosilicate glass compounds on semiconductor wafers. Referring to FIG. 3, the basic components of CVD reactor 50 include a reaction vessel 52, exhaust pump 56, pressure control mechanism 58, and heating coils 60. In operation, wafers 30 are loaded into a cassette or "boat" 32 at the center of reaction vessel 52. A predetermined composition of reactant and inert gases is fed into reaction vessel 52 through flow meters 69 and valves 67. Preferably, the gases are introduced into reaction vessel 52 through a series of inlet openings 62 in feed pipe 64 distributed along the length of reaction vessel 52. Unused reactant gases and reaction by products are removed through exhaust tube 65. Alternatively, the gases may be introduced into one end of the reaction vessel. Thermal energy to support the film forming chemical reactions is supplied by heating coils 60. A conventional CVD reactor, such as an ASM 400/2 Vertical Furnace, may be adapted for use in accordance with the invention as described herein.

Referring again to FIGS. 4 and 5, the pressure is cycled between a higher pressure $P_{high}$ and a lower pressure $P_{low}$. The pressure in reaction vessel 52 is controlled in the same manner previously described for plasma etching—by increasing/decreasing the flow of gases into reaction vessel 52 or increasing/decreasing the flow of unused reactants and reaction by products out of reaction vessel 52, or a combination of both. Pressure control mechanism 58 represents generally any programmable pump controller, such as the dry pump/roots blower and butterfly throttle valve pressure controllers supplied by Alcatel, Inc. In a typical CVD process, the range of pressure flow parameter would be as follows:

$P_{high}$=100–500 millitorr;
$T_{high}$=5–50 milliseconds;

$P_{low}$=50–500 millitorr; and $T_{low}$=5–200 milliseconds.

In a more specific example of a typical CVD process where a layer of doped polysilicon is formed by CVD on wafers 30, and using a 22 to 24 centimeter diameter reaction vessel that is 100 centimeters long, the centerpoint process would operate in the range of 400 sccm to 500 sccm gas flow at 300 millitor and the variable pressure flow parameters would be as follows:

$P_{high}$=350–500 millitorr;

$T_{high}$ 50 milliseconds;

$P_{low}$=200–250 millitorr; and $T_{low}$ 50 milliseconds.

There has been shown and described a novel batch processing system wherein the pressure in the reactor is cycled through a varying pressure to increase the transfer of the reactant materials to the center of the wafers. The particular embodiments shown and described herein are for purposes of example and should not be construed to limit the invention as set forth in the appended claims.

What is claimed is:

1. An apparatus for plasma etching semiconductor wafers, comprising:

a reaction vessel;

a feed means for feeding reactants into the reaction vessel;

a plasma generator operatively coupled to the reaction vessel;

an exhaust means for exhausting unused reactants and/or reaction by-products from the reaction vessel;

a pressure controller configured to continuously cycle the pressure in the reaction vessel between a higher pressure and a lower pressure for at least two cycles; and the higher pressure is in the range of 500 millitorr to 1500 millitorr.

2. An apparatus according to claim 1, wherein the pressure controller comprises a programmable pump controller programmed to cycle the pressure in the reaction vessel between the higher pressure and the lower pressure.

3. An apparatus for plasma etching semiconductor wafers, comprising:

a reaction vessel;

a feed means for feeding reactant gases into the reaction vessel;

a plasma generator operatively coupled to the reaction vessel;

an exhaust means for exhausting unused reactants and/or reaction by-products from the reaction vessel;

a pressure controller configured to continuously cycle the pressure in the reaction vessel between a higher pressure and a lower pressure for at least two cycles; and the lower pressure is in the range of 200 millitorr to 400 millitorr.

4. An apparatus according to claim 3, wherein the pressure controller comprises a programmable pump controller programmed to cycle the pressure in the reaction vessel between the higher pressure and the lower pressure.

5. An apparatus for plasma etching semiconductor wafers, comprising:

a reaction vessel;

a feed means for feeding reactant gases into the reaction vessel;

a plasma generator operatively coupled to the reaction vessel;

an exhaust means for exhausting unused reactants and/or reaction by-products from the reaction vessel;

a pressure controller configured to continuously cycle the pressure in the reaction vessel between a higher pressure and a lower pressure for at least two cycles;

the higher pressure is maintained for a first period of time and the lower pressure is maintained for a second period of time during each cycle; and the first period of time is in the range of 5 milliseconds to 50 milliseconds.

6. An apparatus according to claim 5, wherein the pressure controller comprises a programmable pump controller programmed to cycle the pressure in the reaction vessel between the higher pressure and the lower pressure.

7. An apparatus for plasma etching semiconductor wafers, comprising:

a reaction vessel;

a feed means for feeding reactant gases into the reaction vessel;

a plasma generator operatively coupled to the reaction vessel;

an exhaust means for exhausting unused reactants and/or reaction by-products from the reaction vessel;

a pressure controller configured to continuously cycle the pressure in the reaction vessel between a higher pressure and a lower pressure for at least two cycles;

the higher pressure is maintained for a first period of time and the lower pressure is maintained for a second period of time during each cycle; and the second period of time is greater than 0 and less than or equal to 100 milliseconds.

8. An apparatus according to claim 7, wherein the pressure controller comprises a programmable pump controller programmed to cycle the pressure in the reaction vessel between the higher pressure and the lower pressure.

9. A chemical vapor deposition apparatus for semiconductor wafers, comprising:

a reaction vessel;

a feed means for feeding reactant gases into the reaction vessel;

a source of energy operatively coupled to the reaction vessel to drive a film forming chemical reaction of reactant gases at the surface of the wafers;

an exhaust means for exhausting unused reactants and/or reaction by-products from the reaction vessel;

a pressure controller configured to continuously cycle the pressure in the reaction vessel between a higher pressure and a lower pressure for at least two cycles; and the higher pressure is in the range of 100 millitorr to 500 millitorr.

10. An apparatus according to claim 9, wherein the pressure controller comprises a programmable pump controller programmed to cycle the pressure in the reaction vessel between the higher pressure and the lower pressure.

11. A chemical vapor deposition apparatus for semiconductor wafers, comprising:

a reaction vessel;

a feed means for feeding reactant gases into the reaction vessel;

a source of energy operatively coupled to the reaction vessel to drive a film forming chemical reaction of reactant gases at the surface of the wafers;

an exhaust means for exhausting unused reactants and/or reaction by-products from the reaction vessel;

a pressure controller configured to continuously cycle the pressure in the reaction vessel between a higher pressure and a lower pressure for at least two cycles; and the lower pressure is in the range of 50 millitorr to 500 millitorr.

12. An apparatus according to claim 11, wherein the pressure controller comprises a programmable pump controller programmed to cycle the pressure in the reaction vessel between the higher pressure and the lower pressure.

13. A chemical vapor deposition apparatus for semiconductor wafers, comprising:

a reaction vessel;

a feed means for feeding reactant gases into the reaction vessel;

a source of energy operatively coupled to the reaction vessel to drive a film forming chemical reaction of reactant gases at the surface of the wafers;

an exhaust means for exhausting unused reactants and/or reaction by-products from the reaction vessel;

a pressure controller configured to continuously cycle the pressure in the reaction vessel between a higher pressure and a lower pressure for at least two cycles;

the higher pressure is maintained for a first period of time and the lower pressure is maintained for a second period of time during each cycle; and the first period of time is in the range of 5 milliseconds to 50 milliseconds.

14. An apparatus according to claim 13, wherein the pressure controller comprises a programmable pump controller programmed to cycle the pressure in the reaction vessel between the higher pressure and the lower pressure.

15. A chemical vapor deposition apparatus for semiconductor wafers, comprising:

a reaction vessel;

a feed means for feeding reactant gases into the reaction vessel;

a source of energy operatively coupled to the reaction vessel to drive a film forming chemical reaction of reactant gases at the surface of the wafers;

an exhaust means for exhausting unused reactants and/or reaction by-products from the reaction vessel;

a pressure controller configured to continuously cycle the pressure in the reaction vessel between a higher pressure and a lower pressure for at least two cycles;

the higher pressure is maintained for a first period of time and the lower pressure is maintained for a second period of time during each cycle; and the second period of time is in the range of 5 to 200 milliseconds.

16. An apparatus according to claim 15, wherein the pressure controller comprises a programmable pump controller programmed to cycle the pressure in the reaction vessel between the higher pressure and the lower pressure.

17. An apparatus for plasma etching semiconductor wafers, comprising:

a reaction vessel;

a feed means for feeding reactant gases into the reaction vessel;

a plasma generator operatively coupled to the reaction vessel;

an exhaust means for exhausting unused reactants gases and/or reaction by-products from the reaction vessel; and a pressure controller configured to continuously cycle the pressure in the reaction vessel between a higher pressure in the range of 500 millitorr to 1500 millitorr and a lower pressure in the range of 200 millitorr to 400 millitorr for at least two cycles.

18. A chemical vapor deposition apparatus for semiconductor wafers, comprising:

a reaction vessel;

a feed means for feeding reactant gases into the reaction vessel;

a source of energy operatively coupled to the reaction vessel to drive a film forming chemical reaction of reactant gases at the surface of the wafers;

an exhaust means for exhausting unused reactants gases and/or reaction by-products from the reaction vessel; and a pressure controller configured to continuously cycle the pressure in the reaction vessel between a higher pressure in the range of 100 millitorr to 500 millitorr and a lower pressure in the range of 50 millitorr to 500 millitorr.

* * * * *